(12) United States Patent
Inaba et al.

(10) Patent No.: US 6,525,403 B2
(45) Date of Patent: Feb. 25, 2003

(54) SEMICONDUCTOR DEVICE HAVING MIS FIELD EFFECT TRANSISTORS OR THREE-DIMENSIONAL STRUCTURE

(75) Inventors: Satoshi Inaba, Yokohama (JP); Kazuya Ohuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/960,347

(22) Filed: Sep. 24, 2001

(65) Prior Publication Data

US 2002/0036290 A1 Mar. 28, 2002

(30) Foreign Application Priority Data

Sep. 28, 2000 (JP) .......................... 2000-297672

(51) Int. Cl.$^7$ .......................... H01L 29/94; H01L 29/00; H01L 29/06
(52) U.S. Cl. .......................... 257/618; 257/329; 257/330; 257/331; 257/332; 257/510; 257/511; 257/512; 257/513; 257/514; 257/515; 257/516; 257/517; 257/518; 257/519; 257/520; 257/521; 257/619; 257/622; 257/623
(58) Field of Search .......................... 257/619, 622, 257/623, 329, 330–332, 510–521, 618

(56) References Cited

U.S. PATENT DOCUMENTS

| | | | | |
|---|---|---|---|---|
| 3,893,152 A | * | 7/1975 | Lin | 257/324 |
| 4,296,428 A | * | 10/1981 | Haraszti | 257/331 |
| 4,764,799 A | * | 8/1988 | Malaviya | 257/514 |
| 5,338,942 A | * | 8/1994 | Nishida et al. | 257/17 |
| 5,466,621 A | | 11/1995 | Hisamoto et al. | |
| 5,844,278 A | * | 12/1998 | Mizuno et al. | 257/345 |
| 5,942,768 A | * | 8/1999 | Zhang | 257/72 |
| 6,191,432 B1 | * | 2/2001 | Sugiyama et al. | 257/19 |
| 6,229,161 B1 | * | 5/2001 | Nemati et al. | 257/133 |
| 6,246,090 B1 | * | 6/2001 | Brush et al. | 257/329 |
| 6,373,123 B1 | * | 4/2002 | Clampitt | 257/623 |
| 2001/0002719 A1 | * | 6/2001 | Shimizu et al. | 257/392 |

FOREIGN PATENT DOCUMENTS

| | | | |
|---|---|---|---|
| JP | 2-263473 | 10/1990 | |
| JP | 05-343679 | 12/1993 | |
| JP | 05-343-679 | * 12/1993 | ......... H01L/29/784 |
| JP | 2768719 | 4/1998 | |
| JP | 10-093093 | 4/1998 | |

OTHER PUBLICATIONS

Hisamoto, D. et al., "A Folded–channel MOSFET for Deep–sub–tenth Micron Era", Technical Digest of 1998 International Electron Device Meeting (IEDM), Section 15.7, 3 pages, (Dec. 7, 1998).

Huang, X. et al., "Sub 50–nm FinFET: PMOS", Technical Digest of 1999 International Electron Device Meeting (IEDM), Section 3.4, 4 pages, (Dec. 6, 1999).

Hisamoto, D. et al., "FinFET–A Self–Aligned Double–Gate MOSFET Scalable to 20 nm", IEEE Transactions on Electron Devices, vol. 47, No. 12, pp. 2320–2325 (Dec. 2000).

* cited by examiner

Primary Examiner—Amir Zarabian
Assistant Examiner—Ida M. Soward
(74) Attorney, Agent, or Firm—Finnegan, Henderson, Farabow, Garrett & Dunner, L.L.P.

(57) ABSTRACT

A semiconductor projection is formed on a semiconductor substrate of the first conductivity type and has a semiconductor layer of the first conductivity type. The semiconductor projection has a top surface and side surfaces. A gate electrode is formed above at least the side surfaces of the semiconductor projection. Source and drain regions are formed in the side surfaces of the semiconductor projection on opposite sides of the gate electrode. First and second device isolation insulating films are formed on the semiconductor substrate on opposite sides of the semiconductor projection. A first impurity region is formed in the semiconductor substrate below the first device isolation insulating film. A second impurity region is formed in the semiconductor substrate below the second device isolation insulating film. The first and second impurity regions are in contact with each other in the semiconductor substrate below the semiconductor projection.

25 Claims, 8 Drawing Sheets

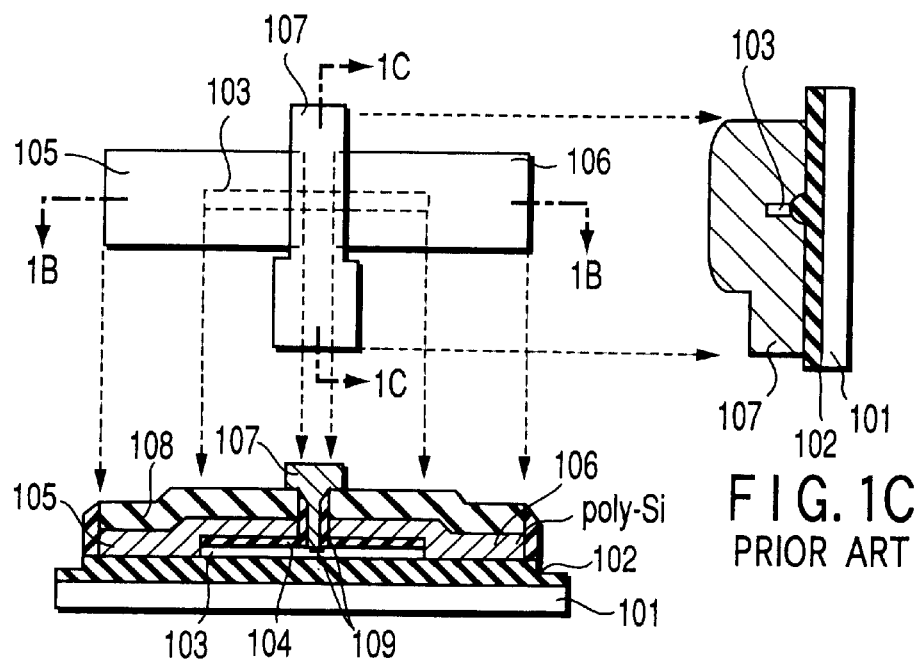
FIG. 1A PRIOR ART
FIG. 1B PRIOR ART
FIG. 1C PRIOR ART
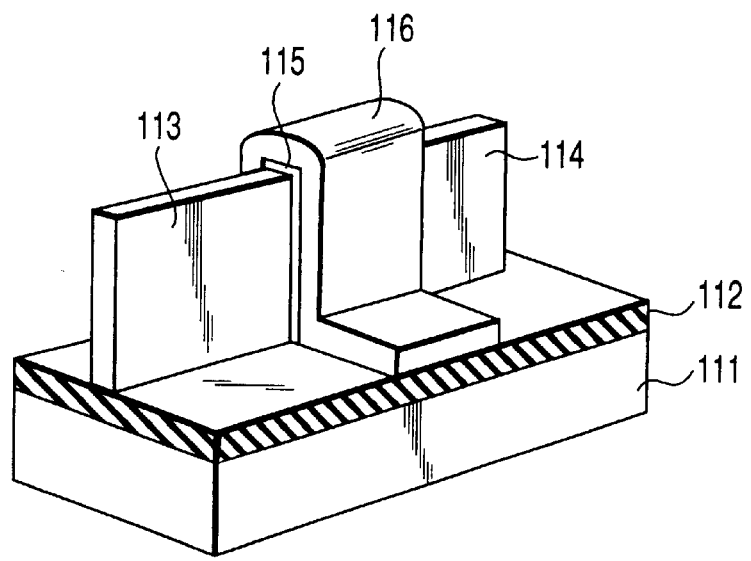
FIG. 2 PRIOR ART

SEMICONDUCTOR DEVICE HAVING MIS FIELD EFFECT TRANSISTORS OR THREE-DIMENSIONAL STRUCTURE

CROSS-REFERENCE TO RELATED APPLICATIONS

This application is based upon and claims the benefit of priority from the prior Japanese Patent Application No. 2000-297672, filed Sep. 28, 2000, the entire contents of which are incorporated herein by reference.

BACKGROUND OF THE INVENTION

1. Field of the Invention

This invention relates to a semiconductor device and more specifically to a MIS field effect transistor (MISFET) of three-dimensional structure.

2. Description of the Related Art

There have been proposals for double-gate fully depleted-SOI MOSFETs which are one type of MISFETs of three-dimensional structure (D. Hisamoto et al. :IEDM 1998 P.1032, X. Huang et al. :IEDM 1999 P.67, Jpn. Pat. Appln. KOKAI Publication No. 2-263473, and Japanese Examined Patent Application No. 2768719). The double-gate fully depleted-SOI MOSFET comprises a SOI (Silicon on Insulator) substrate, a single-crystal silicon strip, and a gate electrode. The single-crystal silicon strip has been made by etching the uppermost layer of the SOI substrate, i.e., a single-crystal silicon layer. The gate electrode lies above the the silicon strip and extends across the silicon strip. The upper surface region and side regions of the strip serve as the channel.

The above MOSFETs provide high current drivability, are more economical of space in the direction of gate width than conventional MOSFETs, and have the short-channel effect controlled. They are therefore promising for devices used in future LSIs.

FIGS. 1A, 1B and 1C show the pattern layout and sections of the MOSFETS. On a semiconductor substrate 101 is formed an insulating layer 102, which is in turn formed on top with a silicon fin layer 103. A source 105 and a drain 106 are formed over the silicon fin layer 103 on opposite sides thereof with an insulating film 104 interposed therebetween.

An insulating film 108 is formed on the source 105 and the drain 106 in order to insulate the source and the drain from a gate electrode 107 to be formed. Also, an insulating film 109 is formed on the sidewall of the groove between the source 105 and the drain 106 in order to insulate them from the gate electrode 107. The gate electrode 107 is formed in the groove.

The implementation of this device involves the use of an expensive SOI substrate, which will increase the manufacturing cost of LSIs that are expected to be mass-produced. In addition, the device reliability may be subject to the quality of the SOI substrate.

A device adapted to perform the same operation as the device of SOI structure as illustrated in FIGS. 1A, 1B and 1C can be implemented using a normal bulk substrate. The device based on a bulk substrate has a substrate projection which forms a device region and is implemented by selectively oxidizing the bottom of the device region.

FIG. 2 is a perspective view of a conventional device using a bulk substrate and FIG. 3 is a cross-sectional view of the device. As shown in FIGS. 2 and 3, an insulating film 112 is formed on a semiconductor substrate 111. A source 113 and a drain 114 are formed on the insulating film 112. A gate electrode 116 is formed over a semiconductor layer 110 between the source 113 and the drain 114 with a gate insulating film 115 interposed therebetween.

With the device shown in FIGS. 2 and 3, however, a decrease in the size of the device region may make it difficult to control the thickness of the oxide film and may cause deformation due to thermal oxidation at high temperatures to affect the device performance With respect to the SOI structure in the aforementioned two devices, it is known that, since the thermal conductivity of the insulating file existing under the silicon layer is lower than that of crystal silicon, self-heating occurs due to Joule heat generated by drain current to cause a degradation in the drain current. Therefore, the devices shown in FIGS. 1A to 1C and FIGS. 2 and 3 cannot necessarily display the performance fully for application to LSIs.

In devices of the SOI structure, holes generated by impact ionization in the channel have their escape cut off and are trapped in the lower portion of the channel, causing the so-called substrate floating effect. This phenomenon is remarkably observed particularly in n-channel field effect transistors. For this reason, there is fear that the substrate floating effect might affect the operation of high-speed switching devices in particular.

An example of a MISFET that is allowed to have a three-dimensional structure through the use of a bulk substrate is one illustrated in U.S. Pat. No. 5,844,278. With this MISFET, the bulk substrate is processed to have a projection shape and the substrate projection shape is made to have such a gate electrode structure as in the aforementioned prior art.

FIGS. 4 and 5 are sectional views of the MISFET in steps of manufacture thereof.

As shown in FIG. 4, a protruding region 121A is formed on a semiconductor substrate 121. A gate insulating film 122 is formed on the protruding region 121A. An insulating film 123 is formed on opposite sides of the protruding region 121A. A mask material 124 is formed on the insulating film 123.

In the structure of FIG. 4, the device is subjected to an ion implantation operation to prevent the occurrence of punch-through in deep portions of source and drain diffusion layers. This ion implantation allows a heavily doped region 125 to be formed at the bottom of the protruding region 121A.

Furthermore, as shown in FIG. 5, shallow source and drain regions 126 are formed in the top surface and the side surface of the protruding region 121A, thereby allowing each of the top surface and the side surface to operate as an almost independent MISFET.

The MISFET shown in FIGS. 4 and 5 is not a device of the SOI structure; for the protruding region 121A and the underlying semiconductor substrate 121 are joined together. Thus, the MISFET has advantages that heat due to the Joule effect and the substrate floating effect are decreased.

However, trying to reduce the gate length (for example, 0.1 μm or less) and operate the device as a completely depleted one makes difficult the process of manufacturing the structure shown in FIGS. 4 and 5. Thus, the demand has increased for developing a structure having a novel structure adapted for the generation of devices in which the gate length is 0.1 μm or less.

BRIEF SUMMARY OF THE INVENTION

According to an aspect of the present invention, there is provided a semiconductor device comprising: a semiconductor projection having a semiconductor layer of a first conductivity type and side surfaces and a top surface, the semiconductor projection being formed on a semiconductor substrate of the first conductivity type; a gate electrode formed above at least the side surfaces of the semiconductor projection with a gate insulating film interposed therebetween; source and drain regions of a second conductivity type formed in the side surfaces of the semiconductor projection so that they are located on opposite sides of the gate electrode; first and second device isolation insulating films formed over the semiconductor substrate on opposite sides of the semiconductor projection; a first impurity region of the first conductivity type formed in a portion of the semiconductor substrate below the first device isolation insulating film; and a second impurity region of the first conductivity type formed in a portion of the semiconductor substrate below the second device isolation insulating film, the second impurity region being in contact with the first impurity region in a portion of the semiconductor substrate below the semiconductor projection.

BRIEF DESCRIPTION OF THE SEVERAL VIEWS OF THE DRAWING

FIG. 1A is a top view of a conventional MOSFET;

FIG. 1B is a sectional view of the MOSFET taken along line 1B—1B of FIG. 1A;

FIG. 1C is a sectional view of the MOSFET taken along line 1C—1C of FIG. 1A;

FIG. 2 is a perspective view of another conventional MOSFET using a bulk substrate;

FIG. 11C is a sectional view taken along line 11C—11C of FIG. 11A;

DETAILED DESCRIPTION OF THE INVENTION

With reference to the accompanying drawings, a semiconductor device embodying the invention will be described in terms of a MIS field effect transistor (MISFET) of the three-dimensional structure.

Figure 6:
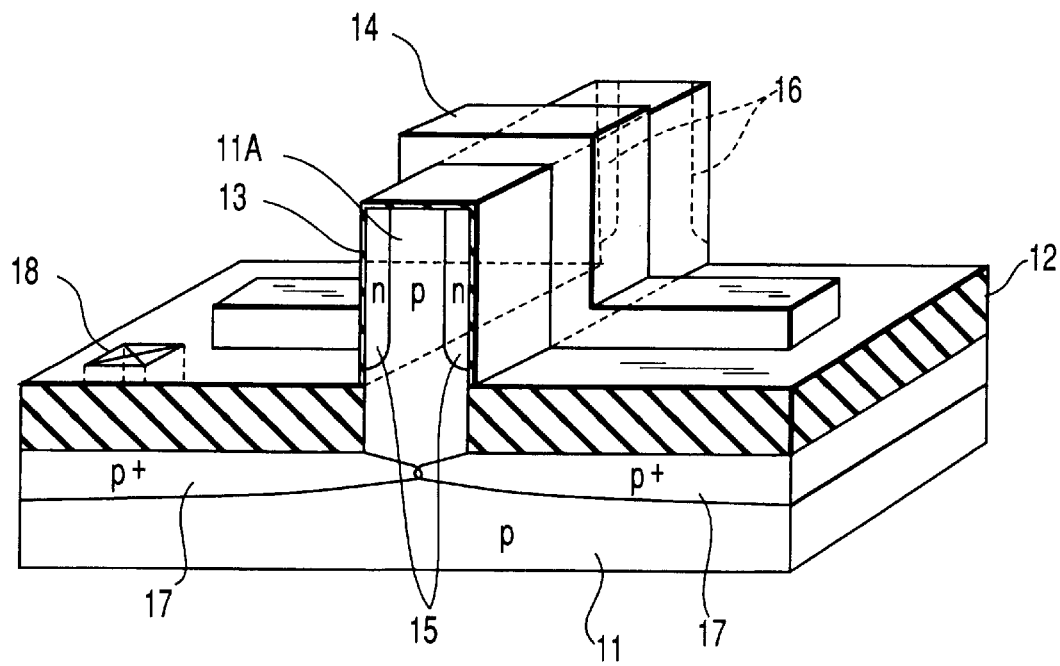
FIG. 6 is a perspective view of a semiconductor device according to a first embodiment of the present invention.

FIG. 6 is a perspective view of a semiconductor device according to a first embodiment of the invention.

As shown in FIG. 6, a p-type silicon semiconductor substrate 11 is processed to have a substrate projection 11A. The projection 11A forms a device region. Portions of the substrate 11 on opposite sides of the projection 11A form device isolation regions. A device isolation insulating film 12 is formed on semiconductor substrate 11 in the device isolation regions. Here, the projection 11A is 0.1 μm or less in thickness (corresponding to the thickness in the direction normal to the direction of the channel length) and 0.5 to 1.0 μm in height from the surface of the substrate 11. The height of the projection need not be limited to 1.0 μm or less and may be more than 1.0 μm if the manufacturing technology permits.

A gate insulating film 13 is formed on top and side with the substrate projection 11A. That is, the gate insulating film 13 is formed to cover the substrate projection 11A. The gate insulating film 13 consists of, for example, silicon oxide formed by thermal oxidation.

A gate electrode 14 is formed on a portion of the gate insulating film 13 that covers the projection 11A. Also, the gate electrode 14 is formed on a portion of the device isolation insulating film 12. After the gate electrode was formed, source diffusion layers 15 and drain diffusion layers 16, which are opposite in conductivity type to the semiconductor substrate 11, are formed in those portions of the side surfaces of the projection 11A which are located on opposite sides of the gate electrode 14. In the step of forming the source and drain regions, phosphorous (P) or arsenic (As) is introduced into the side surfaces of the projection except below the gate electrode by means of ion implantation. The ion implantation is carried out in a self-aligned manner using the gate electrode 14 as a mask.

Although, in the above description, the source and drain regions 15 and 16 are formed only in the side surfaces of the projection 11A, they may also be formed in the top surface of the projection as required. In that case, contact can be made to interconnect layers via the drain and source regions formed in the top surface.

Heavily doped regions 17 of p-type conductivity are formed in the substrate below the device isolation insulating film 12 and the substrate projection 11A. The heavily doped regions 17 are of the same conductivity type as the substrate. That is, the $p^+$-type regions 17 formed by ion implantation in the semiconductor substrate 11 below the device isolation insulating film 12 on opposite sides of the substrate projection 11A are joined together in the substrate below the projection.

A contact plug 18 is formed in the device isolation insulating film 12 to establish electrical connection between the semiconductor substrate 11 and an interconnect layer not shown. Since the $p^+$-type regions 17 have been formed on top of the substrate 11, ohmic contact can be obtained between the contact plug 18 and the substrate 11 without performing ion implantation anew at the time of forming the contact plug.

The semiconductor device shown in FIG. 6 serves the same function as the previously described conventional SOI substrate-based MISFET through the use of the bulk substrate. The gate electrode 14 needs a contact area (not shown) for connection to an interconnect layer. For this reason, the gate electrode 14 is formed to overlap the substrate 11 in the device isolation region.

With the semiconductor device, in order to maintain device-to-device isolation, it is required to control the short channel effect caused by a parasitic MISFET and to cause the parasitic MISFET in the overlapping portion of the gate electrode and the semiconductor substrate in the device isolation region to turn off at all times under actually used operating voltages.

In this embodiment, therefore, the $p^+$-type regions 17 is formed in the substrate in the device isolation region including portions just below the gate electrode 14 by doping p-type impurities of opposite conductivity type to carriers in the channel. Further, the device isolation insulating film 12 on the substrate in the device isolation region is formed to be large in thickness, so that the insulating film that acts effectively as a gate insulating film in the overlapping portion of the gate electrode and the semiconductor substrate is made large in thickness. For this reason, the threshold voltage of the parasitic MISFET formed in the device isolation region can be increased, allowing the parasitic MISFET to be in the off state at all times. For example, to form an n-channel MISFET, boron (B) is introduced into the device isolation region to form the $p^+$-type impurity regions 17.

If the thickness of the substrate projection 11A (the thickness in the direction normal to the direction of the channel length) is smaller than the maximum width Wd of the depletion layer formed in the substrate projection 11A when a voltage is applied to the gate electrode, then the entire substrate projection will be filled with the depletion layer at the time of operation. Thus, the MISFET of this embodiment performs the same operation as a fully depleted SOI device. In this case, even if the doping level of the substrate projection 11A is low, since potential control in the channel is performed by the gate electrode on the sidewalls of the projection, it is possible to control the short channel effect with ease in comparison with a planar MISFET of the conventional structure.

For the same operation as the SOI device, the doping concentration of the substrate projection 11A can be set low, thus allowing the magnitude of electric field in the vertical direction produced by impurities in the substrate to be smaller than in normal planar MISFETs and the carrier mobility represented by a function of the vertical electric field to be larger than in the planar devices. Therefore, the MISFET of this embodiment provides higher current drivability than the planar devices even with the same operating voltage and the same gate width.

Decreasing the thickness of the substrate projection 11A causes lateral diffusion of impurities which are ion implanted vertically into the semiconductor substrate 11 in the device isolation region, resulting in the substrate region below the projection 11A being doped. That is, the $p^+$-type doped regions 17 on opposite sides of the projection are joined together in the substrate region below the projection, so that the P+-type doped region is also formed below the projection. With the semiconductor device of this embodiment, therefore, the device isolation characteristic can be improved because not only the substrate region in the device isolation region but also the substrate region below the substrate projection 11A can be doped with impurities. That is, the occurrence of punch-through can be prevented and the isolation between adjacent devices can be maintained.

In the semiconductor device of this embodiment which performs the same operation as fully depleted SOI devices, since its channel region is not isolated from the underlying semiconductor substrate by an insulating film low in thermal conductivity, the heat conduction characteristic can be improved, allowing a degradation in current caused by heat due to the Joule effect to be minimized.

Second Embodiment

In general, in the case of MISFETs using the SOI substrate, when a device that is very short in channel length is formed with the doping concentration of the substrate reduced, there is the possibility that punch-through occurs between source and drain as a result of extension of the depletion layer from the drain side. In order to control the short channel effect, the extension of the depletion layer must be controlled.

With conventional fully-depleted planar MISFETs using the SOI substrate, the occurrence of punch-through is controlled by making the channel forming silicon layer very thin. When the gate length is reduced to 100 nm or less, the silicon layer must be made much smaller in thickness than the gate length, which increases the difficulty in fabricating devices.

Consider here the case where, in the device of FIG. 6, the substrate projection is made large in height and the channel width is made large so as to increase effectively the area in which current flows.

In this case, the transistor portion formed in the side surfaces of the substrate projection, as a thin-film device that performs the same operation as SOI devices, is relatively effective in controlling the short channel effect. The reason is that the thickness of the channel forming silicon layer is defined by the width of the substrate projection and the double-gate structure functions favorably.

The transistor formed in the top surface of the substrate projection is affected by the drain impurity diffusion layers formed in the side surfaces of the projection, so that the drain junction depth increases and the effective SOI film thickness in the vertical direction looks large.

As a result, depending on the source/drain structure, the extension of the depletion layer on the drain side increases, making punch-through between source and drain easy to occur. This is prominent particularly in the case where the substrate projection is 0.1 $\mu$m or more in height. For this reason, trying to increase the apparent current drivability by increasing the height of the substrate projection for compensation of the channel width results in increased possibility of punch-through.

Figure 3:
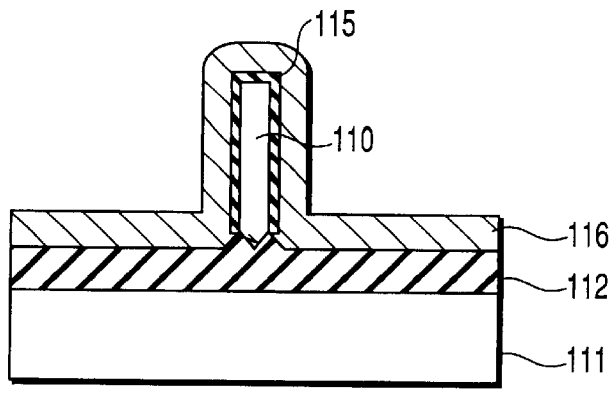
FIG. 3 is a sectional view of the MOSFET of FIG. 2.
Figure 4:
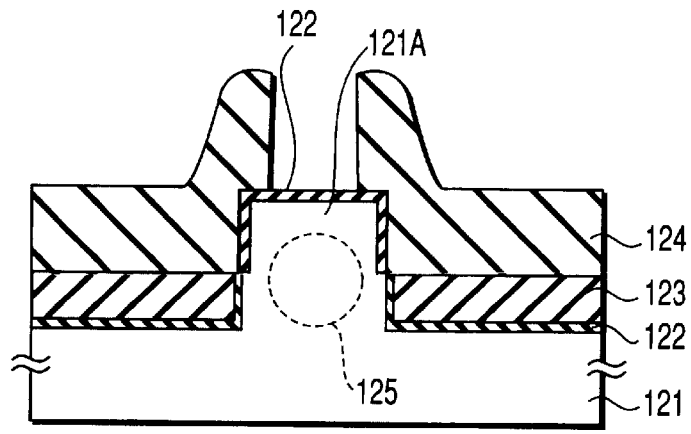
FIGS. 4 and 5 are sectional views of still another conventional MISFET in steps of manufacture.
Figure 5:
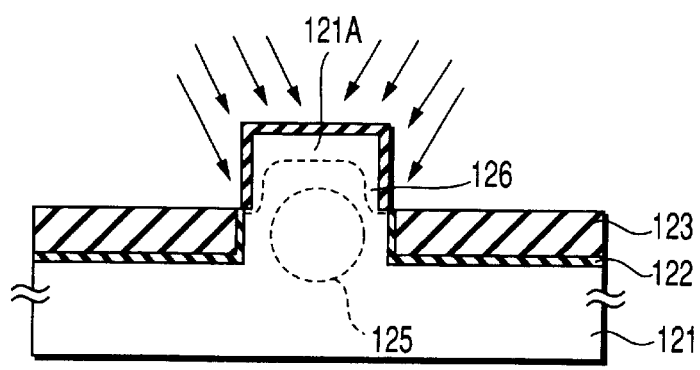

It is the prior art shown in FIG. 4 that is intended to remedy this drawback by optimizing the substrate doping profile. In this case as well, however, increasing the gate width, i.e., increasing the height of the substrate projection, results in difficulty in doping the entire region in which punch-through can occur with impurities. The effective upper limit of the gate width is determined by the range of depth to which impurities can be doped by the ion implantation technology.

The second embodiment is intended to prevent the occurrence of punch-through between source and drain even with a very fine gate electrode formed by preventing the channel from being formed in the top surface of the substrate projection, i.e., by using only the side surfaces of the projection as the channel. Unlike the prior art, the semiconductor device according to the second embodiment of the present invention is basically characterized in that the top portion of the substrate projection is not used as the channel.

Figure 7:
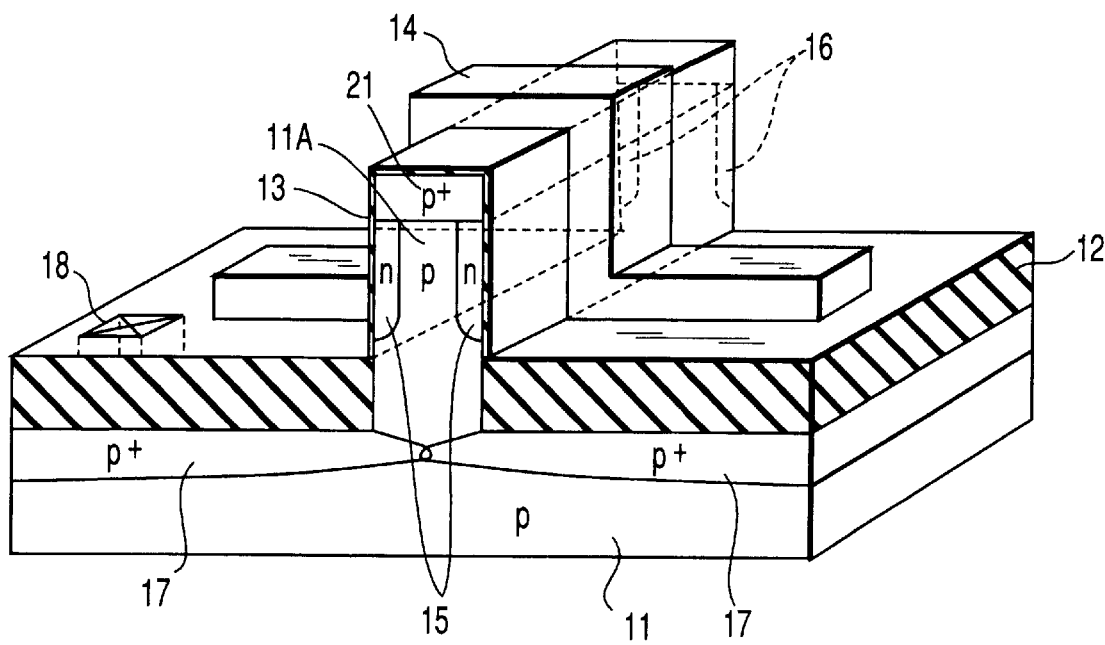
FIG. 7 is a perspective view of a semiconductor device according to a second embodiment of the present invention.
Figure 8:
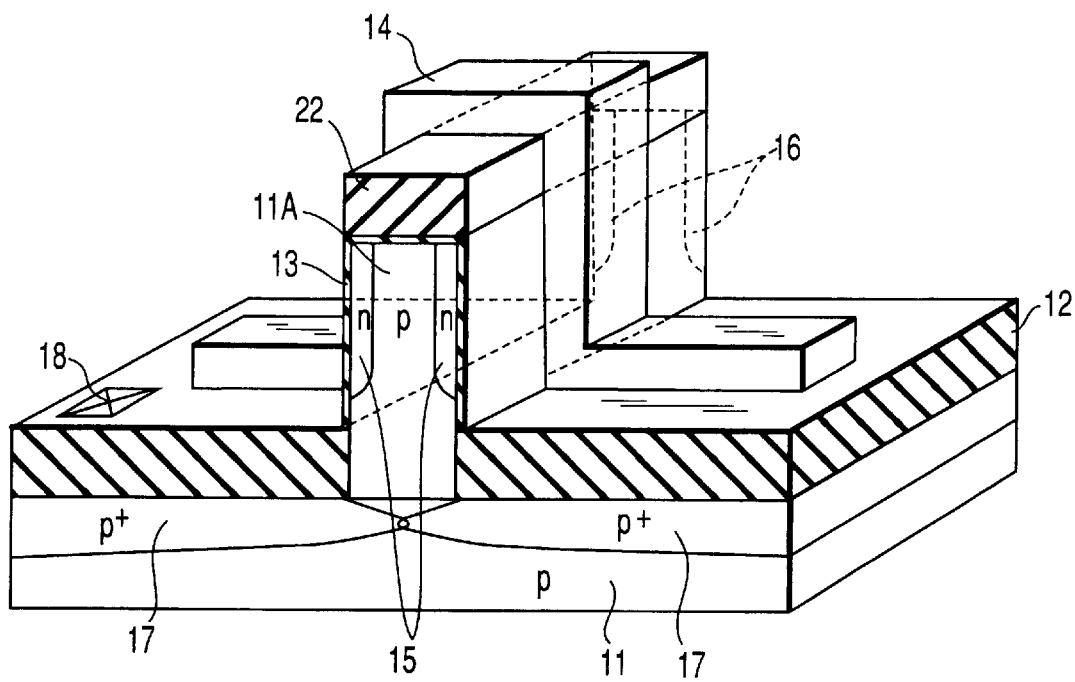
FIG. 8 is a perspective view of a semiconductor device according to a modification of the second embodiment of the present invention.
Figure 9:
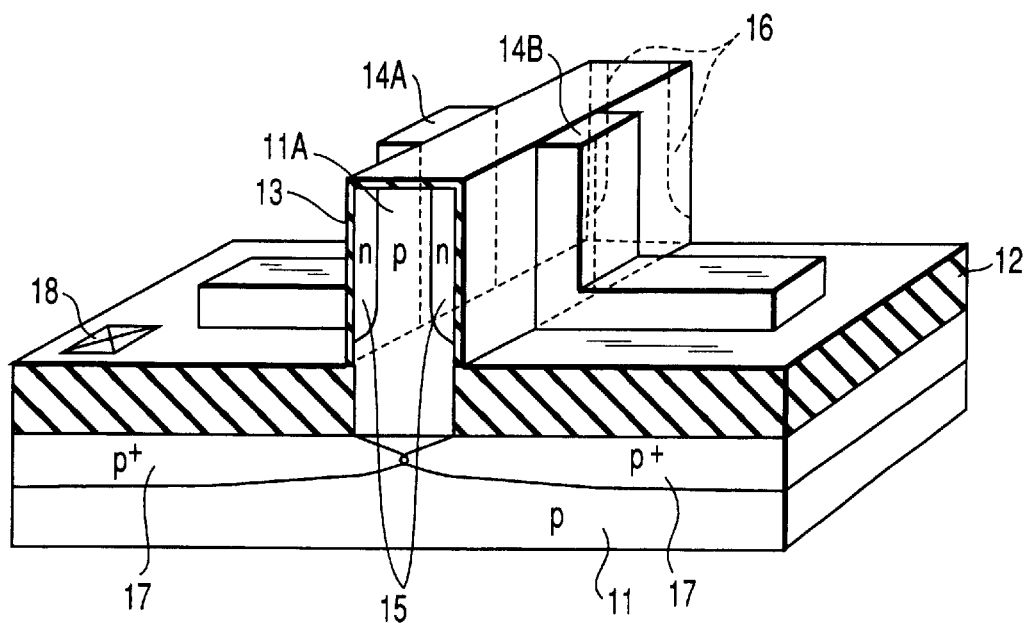
FIG. 9 is a perspective view of a semiconductor device according to another modification of the second embodiment of the present invention.

Examples of structures such that no channel is formed in the top surface of the substrate projection are illustrated in FIGS. 7, 8 and 9. In the example of FIG. 7, the top surface is doped with impurities of opposite conductivity type to carriers in the channel. In the example of FIG. 8, the gate oxide film formed on the top of the substrate projection is made sufficiently large in thickness so as not to allow the channel to be formed under actually used operating voltages. In the example of FIG. 9, the gate electrode is formed so that it is not located on the top surface of the projection. Any combination of these three structures may be used.

The structures shown in FIGS. 7, 8 and 9 will be described below in detail.

FIG. 7 is a perspective view of a semiconductor device according to the second embodiment.

A region 21 is formed in the upper portion of the substrate projection 11A, as shown in FIG. 7. The region 21 is doped with p-type impurities of opposite conductivity type to carriers in the channel. Otherwise, the device of FIG. 7 remains unchanged from the device of FIG. 6.

The semiconductor device of such a structure is fabricated as follows: First, in forming the substrate projection 11A, an insulating film as a cap film, such as a film of silicon nitride, is formed over the surface of the semiconductor substrate 11 and then patterned in the form of a strip. The semiconductor substrate is then subjected to reactive ion etching (RIE) using the silicon nitride film as a mask, whereby the substrate projection 11A of a given width (thickness) and height is formed.

After the formation of the projection, impurities are introduced vertically into the top surface of the projection by means of ion implantation. For an n-channel MISFET as in this embodiment, boron (B) is implanted at 15 keV and at a dose of $5 \times 10^{13}$ cm$^{-2}$ or more.

Subsequently, the gate insulating film 13 is formed on the top surface and the side surfaces of the projection by means of thermal oxidation. A film of polysilicon is deposited onto the gate insulating film 13 and then patterned to form the gate electrode 14.

Moreover, impurities of, for example, P or As are introduced into the side surfaces of the projection 11A except their portions below the gate electrode 14 by means of ion implantation, thereby forming the source and drain regions 15 and 16.

FIG. 8 is a perspective view of a semiconductor device according to a modification of the second embodiment.

An insulating film 22 is formed on the substrate projection 11A as shown in FIG. 8. It is recommended that as the insulating film 22 the cap film (for example, silicon nitride film) used in forming the substrate projection be used as it is. Alternatively, a silicon oxide film may be separately formed as the insulating film 22. Otherwise, the device of FIG. 9 remains unchanged from the device of the first embodiment.

With the semiconductor device thus constructed, the insulating film present between the gate electrode 14 and the top surface of the substrate projection 11A can be made sufficiently thick so as not to allow the channel to be formed under usually used operating voltages.

The semiconductor device of such a structure is fabricated as follows: First, in forming the substrate projection 11A, an insulating film as a cap film, such as a film of silicon nitride, is formed over the surface of the semiconductor substrate 11 and then patterned in the form of a strip. The semiconductor substrate is then subjected to reactive ion etching (RIE) using the silicon nitride film as a mask, whereby the substrate projection 11A is formed.

Subsequently, the gate insulating film 13 consisting of silicon oxide is formed on the side surfaces of the projection by means of thermal oxidation with the insulating film 22 left. A film of polysilicon is deposited onto the gate insulating film 13 and the insulating film 22 and then patterned to form the gate electrode 14.

Moreover, impurities, such as P or As, are introduced into the side surfaces of the projection 11A except their respective portions below the gate electrode 14 by means of ion implantation, thereby forming the source and drain regions 15 and 16.

FIG. 9 is a perspective view of a semiconductor device according to another modification of the second embodiment.

As shown in FIG. 9, no gate electrode is formed on top of the projection 11A, but gate electrodes 14A and 14B are formed only on the sidewalls of the projection. That is, two gate electrodes 14A and 14B are formed on the sidewalls of the projection so as to sandwich the projection and self-align to each other. The two gate electrodes are arranged on a straight line perpendicular to the direction of the channel length. With this semiconductor device, the gate electrode is separated into two; thus, it is required to provide each of the two electrodes with a separate contact. Otherwise, the device of FIG. 9 remains unchanged from the device of the first embodiment.

The semiconductor device thus constructed can be used in the double-gate FET mode in which the same bias voltage is applied to the two gate electrodes 14A and 14B. It is also possible to apply a different voltage to each of the gate electrodes 14A and 14B.

An example of applying a different voltage to each of the two gate electrodes 14A and 14B is the backgate FET mode in which one of the two electrodes is supplied with a gate voltage for channel control and the other is supplied with a different voltage as the substrate potential. Although such a fully depleted device as shown in FIG. 7 is not allowed to change the threshold voltage after fabrication, the device shown in FIG. 9 is allowed to control the threshold voltage when used in the backgate PET mode.

A plurality of semiconductor devices shown in FIG. 9 can be used simultaneously, in which case modifications to the interconnections and the power supply system would allow some devices to operate in the double-gate FET mode and other devices to operate in the backgate PET mode.

The semiconductor device of such a structure as shown in FIG. 9 is fabricated as follows: First, in forming the substrate projection 11A, an insulating film as a cap film, such as a film of silicon nitride, is formed over the surface of the semiconductor substrate 11 and then patterned in the form of a strip. The semiconductor substrate is then subjected to reactive ion etching using the silicon nitride film as a mask, whereby the substrate projection 11A is formed.

Subsequently, the gate insulating film 13 consisting of silicon oxide is formed on the side surfaces of the projection by means of thermal oxidation with the silicon nitride film left. A film of polysilicon is deposited onto the gate insulating film 13 and the insulating film 22 and then patterned to form the gate electrode 14.

After that, the polysilicon film present on the top of the projection is removed by means of CMP or RIE. Moreover, the insulating film present on the top of the projection is removed. Furthermore, impurities, such as P or As, are introduced into the side surfaces of the projection 11A except their respective portions below the gate electrode 14 by means of ion implantation, thereby forming the source and drain regions 15 and 16.

In this case, it is possible to form a self-aligned double-gate MISFET that performs the same operation as an SOI device.

Each of the semiconductor devices of the second embodiment is allowed to perform the same operation as fully depleted MISFETs using the SOI substrate.

The structure to prevent the channel from being formed in the upper portion of the substrate projection 11A will not provide a very serious damage under conditions that the width of the substrate projection 11A must be made small and the height of the projection must be set to 1 μm or more to obtain current drivability. If anything, it is apparent that the feature of the present invention of not using the top surface (upper portion) of the substrate projection for the channel provides effective means for controlling the short channel effect.

In the case of transistor operation using only the side surfaces of the substrate projection, in order to increase carrier mobility, it is required in the case of silicon that the side surface of the projection be parallel to the (100) plane and the channel be oriented in the direction of [100].

Third Embodiment

With the conventional three-dimensional MISFET shown in FIGS. 1A to 1C and FIG. 2, in order to implement a fully depleted SOI device, it is required to make the thickness of the channel region small. If the thickness is 50 nm or less, it is advantageous to the formation of shallow junctions for source and drain regions. On the other hand, the source and drain regions becomes very thin in comparison with conventional planar MISFETs. For this reason, parasitic resistance associated with the source and drain regions becomes high. As a result, there will be a degradation in current drivability.

The third embodiment is therefore intended to provide a MISFET which uses a thick substrate projection in which, as shown in FIGS. 10 and 11A to 11D, the channel region and its neighborhood are made small in thickness, whereas the region in which the source and drain are to be formed are made large in thickness, thereby allowing the increase of the parasitic resistance to be minimized.

Figure 10:
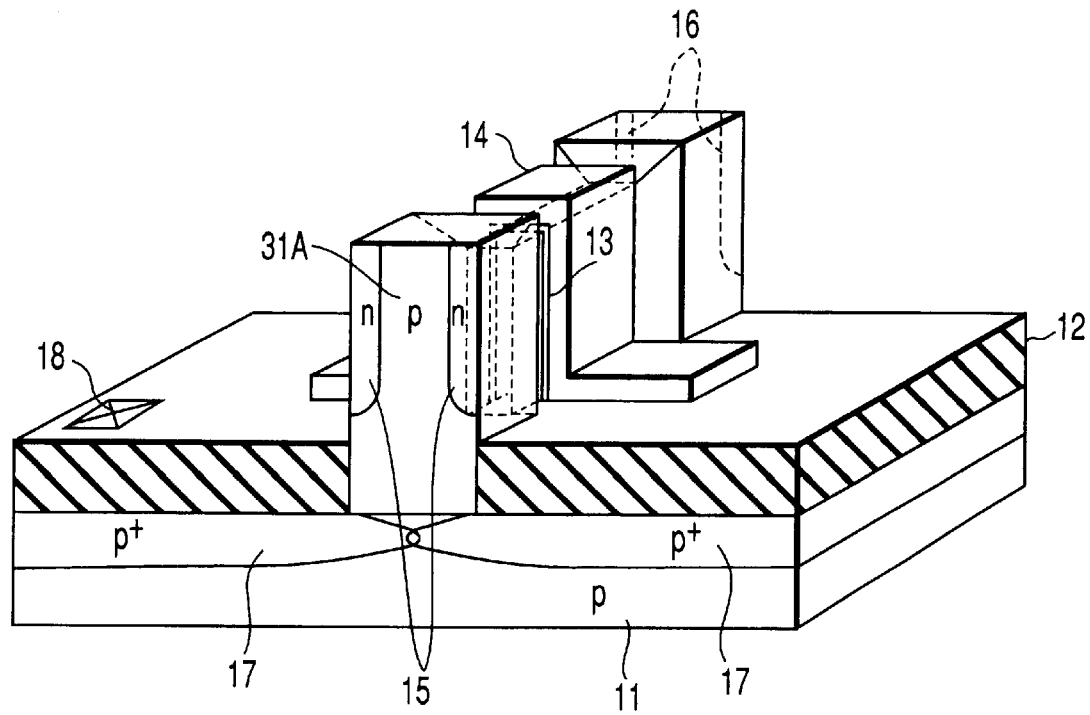
FIG. 10 is a perspective view of a semiconductor device according to a third embodiment of the present invention.
Figures 11A, 11B, 11D:
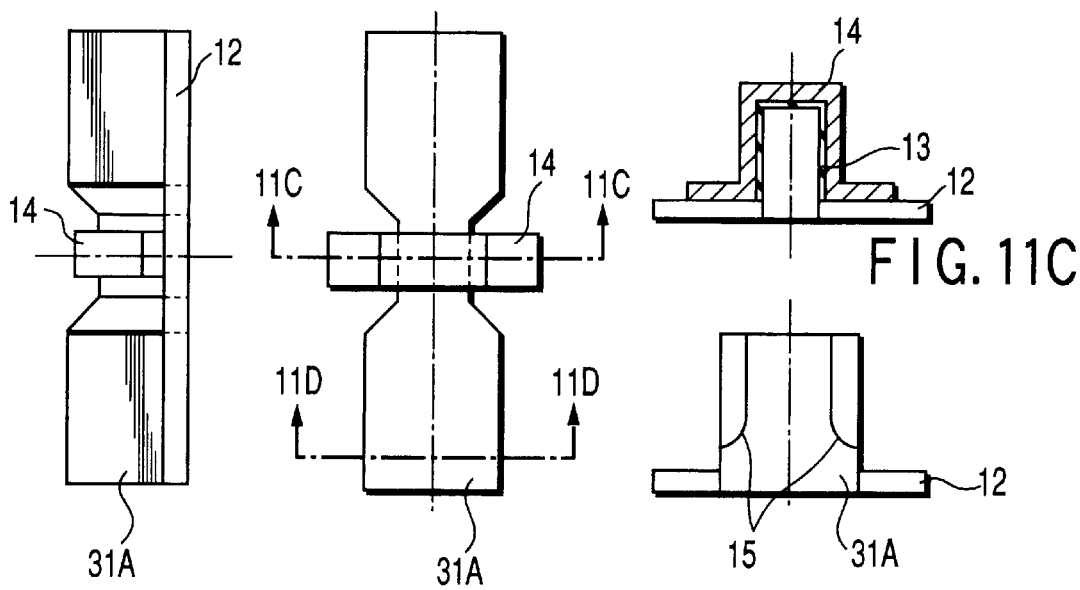
FIG. 11A is a top view of the semiconductor device of the third embodiment.
FIG. 11B is a side view of the semiconductor device of the third embodiment.
FIG. 11D is a sectional view taken along line 11D—11D of FIG. 11A.

FIG. 10 is a perspective view of a semiconductor device according to the third embodiment. FIG. 11A is a plan view of the semiconductor device. FIG. 11B is a side view of the semiconductor device. FIG. 11C is a cross-sectional view of the semiconductor device taken along line 11C—11C of FIG. 11A. FIG. 11D is a cross-sectional view of the semiconductor device taken along line 11D—11D of FIG. 11A.

The semiconductor device shown in FIGS. 10 and 11A to 11D are fabricated in the following way. The device geometry somewhat varies according to the fabrication method.

First, portions of a thick silicon substrate 11 around the region which is to form a projection are etched away to form the substrate projection of 0.15–0.20 μm in width. The direction of the width of the projection is parallel to the surface of the substrate 11 and normal to the direction from source to drain (i.e., the direction of the channel length). Next, an insulating film of, for example, silicon nitride is deposited which is to be used as a mask in forming the gate electrode. The silicon nitride film is patterned using lithographic techniques to form a groove in that film.

The semiconductor substrate 11 is subjected to oxidation to form an oxide film of 50–100 nm in thickness, the oxide film comes to have a region which resembles a bird's beak as is well known in the LOCOS process. After that, by selectively removing the oxide film, the substrate projection 31A is formed which is thick in the source and drain portions and thin in the channel portion and part of the diffusion portion near the channel.

After that, the gate insulating film 13 is formed on the top surface and the side surfaces of that portion of the projection 31A which is made thin in the gate electrode forming mask. A polysilicon film is formed on the gate insulating film 13 in the gate electrode forming mask and the excess polysilicon film is polished by CMP to form the gate electrode 14.

Next, the gate electrode forming mask material (the silicon nitride film) is removed. After that, ion implantation or vapor phase doping is performed on the side surfaces (source and drain formed portions) of the substrate projection except the channel region, thereby forming deep, low-resistivity source and drain diffused layers 15 and 16. At the same time, shallow junctions are formed in the diffused portions near the channel region. When the adjustment of doping conditions is required for the diffused portions and the deep junction portions, it is possible to form the deep junctions by forming the gate sidewall after the formation of the shallow junctions in the diffused portions as in the case of conventional planar MISFETs. the same structure can also be formed by applying the elevated source/drain structure using epitaxial techniques after the formation of a transistor in the substrate projection.

Although, in this embodiment, the source diffused layers 15 and the drain diffused layers 16 are formed only in the side surfaces of the substrate projection 31A, they may be formed in the top surface of the projection as required. In that case, contacts may be made to interconnect layers via the source and drain diffused layers 15 and 16 formed in the top surface.

Fourth Embodiment

As described previously, in order to make a MISFET that performs the same operation as SOI devices having a very fine gate regardless of whether it is of the conventional type or the three-dimension type, it is required to form the channel portion from a very thin silicon layer. Depending on circumstances, however, the structures described so far are expected to make it very difficult to process semiconductor substrates through lithographic and RIE techniques in particular.

The fourth embodiment is therefore intended to provide a three-dimensional MISFET that performs the same operation as SOI devices by forming a substrate projection of a relatively large thickness of, for example, the order to 0.5 to 1.0 μm. The fourth embodiment is characterized by forming an intrinsic pillar as a substrate projection and then forming a stacked channel structure of stacked $p^+/n^-/p^-$ layers.

Figure 12:
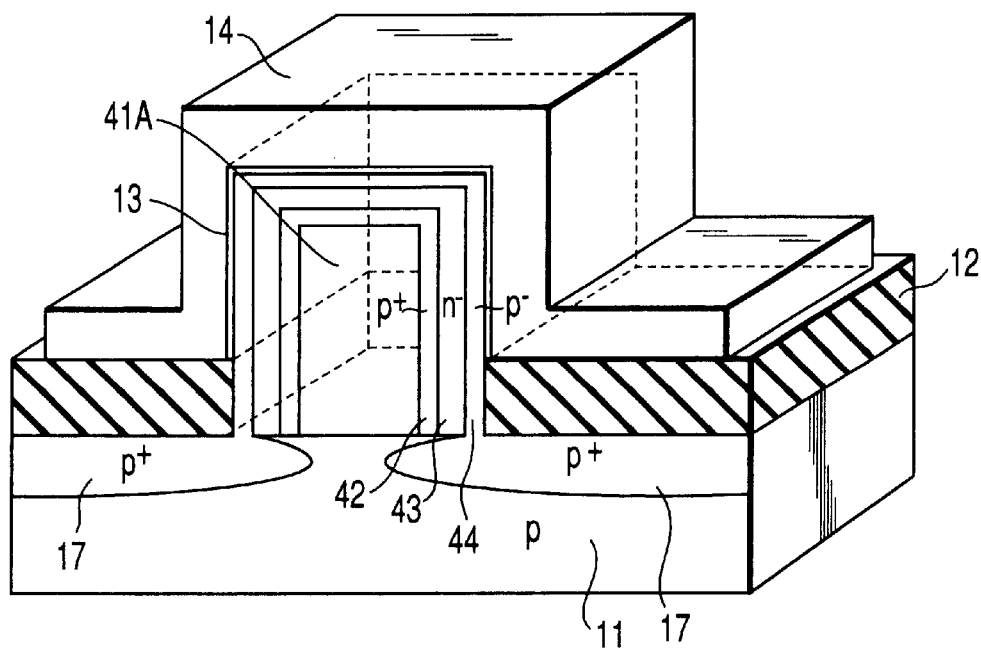
FIG. 12 is a perspective view of a portion of a semiconductor device according to a fourth embodiment of the present invention.

FIG. 12 is a perspective view of a portion of a semiconductor device of the fourth embodiment. FIG. 12 shows particularly the channel portion, and the projection in which the source and drain diffused layers are formed is made large in thickness as illustrated in FIGS. 10 and 11A to 11D.

First, to form a substrate projection 41A, an insulating film as a cap film, such as a film of silicon nitride, is formed over the surface of a p-type semiconductor substrate 11 and then patterned into the shape of a strip. The semiconductor substrate is then subjected to reactive ion etching using the silicon nitride film as a mask, whereby an intrinsic pillar of a given width (thickness) and height is formed. A p$^+$-type layer 42, an n$^-$-type layer 43 and a p$^-$-type layer 44 are formed in this order on the top surface and the side surfaces of the pillar, i.e., so as to surround the pillar, to form the substrate projection 41A.

Next, a gate oxide film 13 consisting of silicon oxide is formed on the side surfaces and the top surface of the substrate projection 41A by means of thermal oxidation. A polysilicon film is deposited on the gate insulating film 13 and then patterned to form a gate electrode 14.

Figure 13:
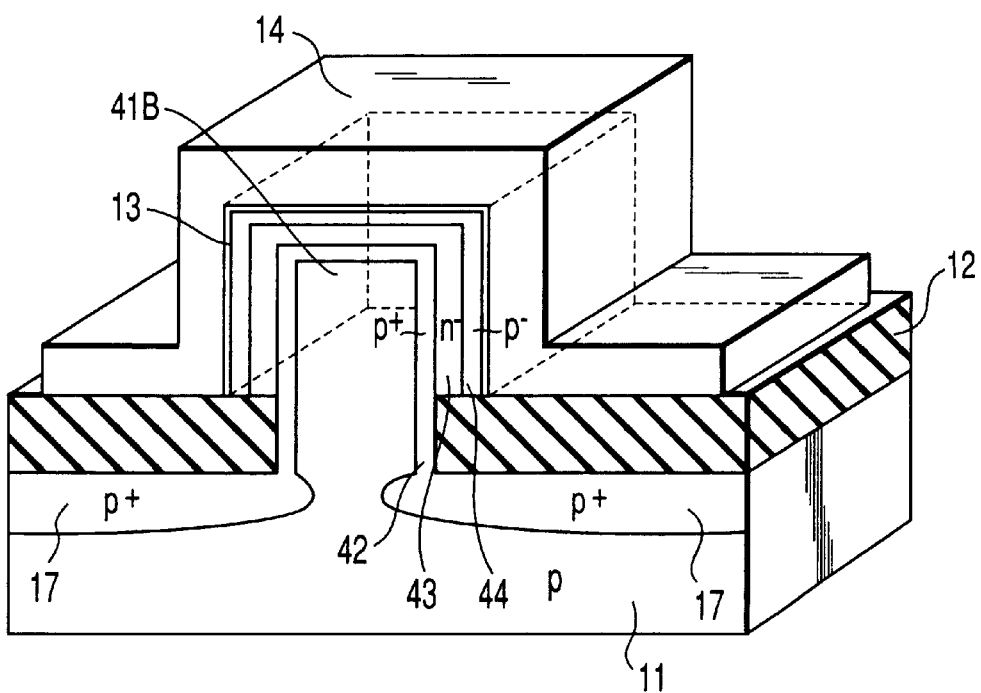
FIG. 13 is a perspective view of a portion of a semiconductor device according to a modification of the fourth embodiment of the present invention.

FIG. 13 is a perspective view of a portion of a semiconductor device according to a modification of the fourth embodiment. FIG. 13 shows particularly the channel portion, and the projection in which the source and drain diffused layers are formed is made large in thickness as illustrated in FIGS. 10 and 11A to 11D.

First, to form a substrate projection 41B, an insulating film as a cap film, such as a film of silicon nitride, is formed over the surface of a p-type semiconductor substrate 11 and then patterned into the shape of a strip. The semiconductor substrate is then subjected to reactive ion etching using the silicon nitride film as a mask, whereby an intrinsic pillar of a given width and height is formed.

Subsequently, impurities of, for example, boron are introduced into the device isolation region of the semiconductor substrate 11 through ion implantation to form p$^+$-type doped regions 17. At the same time, the impurities are also introduced into the pillar to form a p$^+$-type layer 42. After that, a device isolation insulating film 12 of, for example, silicon oxide is formed over the device isolation region of the semiconductor substrate 11.

An n$^-$-type layer 43 and a p$^-$-type layer (channel layer) 44 are grown over the p$^+$-type layer 42, thereby forming the substrate projection 41B.

With the semiconductor device shown in FIG. 13, the formation of the p$^+$-type doped region 17 into the device isolation region of the semiconductor device 11 is carried out when the pillar is still thin, that is, immediately after the pillar has been formed. As a result, the p-type impurities diffuse to under the substrate projection, allowing the p$^+$-type doped region 17 to come in contact with the innermost p$^+$-type layer 42 of the pillar. Thus, the potential application to the p$^+$-type doped region 17 results in the potential application to the p$^+$-type layer 42 of the substrate projection 41B, allowing the device to operate as a four-terminal device.

Figure 14:
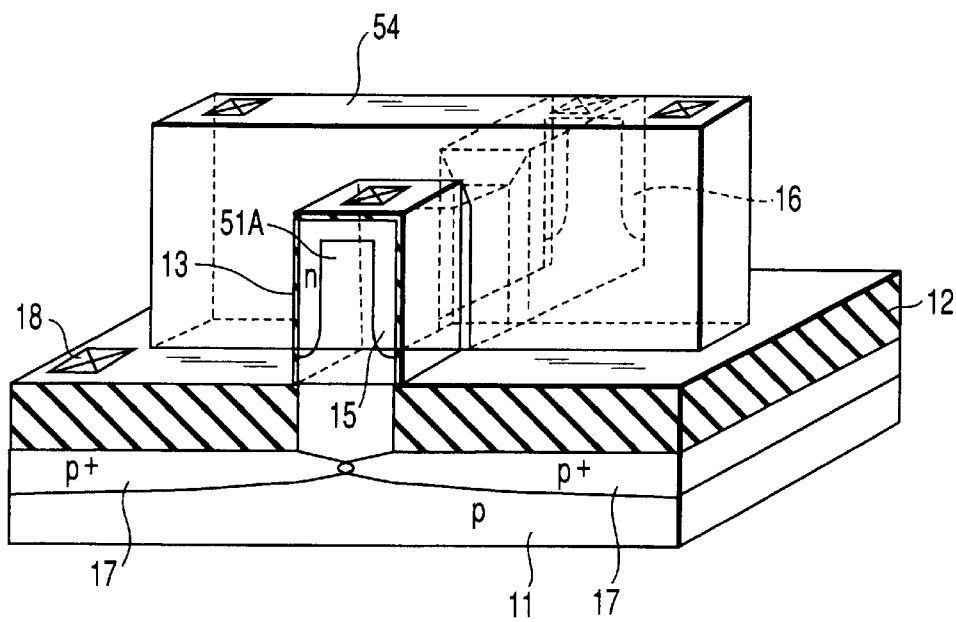
FIG. 14 is a perspective view of a semiconductor device according to a fifth embodiment of the present invention.

With the semiconductor device shown in FIG. 12 or 14, setting the thickness and doping level of the n$^-$-type layer 43 so that it is fully depleted without depending on gate voltage and optimizing the doping levels of the p$^+$-type layer 42 and the p$^-$-type layer 44 allow the depletion layer formed in the n-type layer 43 to provide isolation between the p$^-$-type layer 44 in which the channel is formed and the semiconductor substrate 11. It therefore becomes possible to realize a device structure equivalent to MISFETs using the SOI substrate. In this case, to implement a fully depleted device, the thickness of the channel layer (p$^-$-type layer 44) is simply made small.

Moreover, the center pillar of the substrate projection 41A or 41B can be formed to any thickness. Thus, the thickness of the pillar can be set so that the substrate can be processed easily to form the substrate projection with the same structure as thin-film SOI devices. Thus, the difficulties involved in fabricating the device can be decreased.

FIGS. 12 and 13 depict, in enlarged view, only the channel portion just below the gate. In the source and drain, it is required that their respective diffused layers be not in contact with the n$^-$-type layer 43. For the source and drain structures, therefore, such elevated source/drain structures using selective epitaxial growth as used in the device shown in FIGS. 10 and 11A to 11D or halo structures (pocket structures) are recommended. The use of these structures allows easy prevention of the source and drain diffused layers (n+-type layers) from coming into contact with the n-type layer 43 and the channel structures shown in FIGS. 12 and 13 to be implemented.

Although the fourth embodiment has been described in terms of an n-channel field effect transistor, the principles of the invention can be applied to a p-channel field effect transistor by reversing the conductivity type of impurities. By performing doping of the well and the channel separately and optimizing the halo structure, devices equivalent to high-performance CMOS SOI devices can be implemented.

Fifth Embodiment

In the previously described three-dimensional MISFETs, increasing the channel width, i.e., the height of the substrate projection, makes large the difference in level between the gate contact area and the source and drain contact areas, which, in future, may cause a problem of difficulty in forming the contacts using the same process. For example, to set the channel width to about 2 μm, it is required to set the height of the substrate projection to about 1 μm. In this case, processing problems make it impossible to increase the thickness of polysilicon as the gate electrode to the level corresponding to the height of the substrate projection. When the polysilicon is formed at a thickness corresponding to the height of the substrate projection, the aspect ratio becomes so large as to make it impossible to etch polysilicon by means of RIE.

The actual thickness of polysilicon that can be deposited is at most 200 nm, and a step of about 800 nm is created between the top of the substrate projection and the top of the gate electrode. For example, to form a contact hole as small as 150×150 nm, it is required to form a hole of a very large aspect ratio (5.3 plus an aspect ratio of the insulating film 12) by means of RIE because the step is large. At present this is very difficult in view of the capabilities of lithographic and RIE techniques.

The fifth embodiment is therefore intended to provide a three-dimensional MISFET in which the gate electrode is shaped as shown in FIG. 14 and the difference in level between the source and drain contact areas on the substrate projection and the gate contact areas is less than 200 nm.

FIG. 14 is a perspective view of a semiconductor device of the fifth embodiment.

First, portions of the p-type silicon substrate 11 around the region which is to form a projection are etched to form the substrate projection of about 2 μm in width. The direction of the width of the projection is parallel to the surface of the substrate 11 and normal to the direction from source to drain (i.e., the direction of the channel length). Next, an insulating film of, for example, silicon nitride is deposited which is to be used as a mask in forming the gate electrode. The silicon nitride film is etched using lithographic and RIE techniques to form a groove in that film.

The semiconductor substrate 11 is subjected to oxidation to form an oxide film of 50–100 nm in thickness, in which case the oxide film comes to have a region which resembles a bird's beak as is well known in the LOCOS process. After that, by selectively removing the oxide film, a substrate projection 51A is formed which is thick in the source and drain portions and thin in the channel portion and part of the diffusion portion near the channel.

After that, the gate insulating film 13 is formed on the top surface and the side surfaces of that portion of the projection 51A within the gate electrode forming mask. A polysilicon film is buried in the gate electrode forming mask and the excess polysilicon film is polished by CMP to form the gate electrode 54.

When the thickness of the polysilicon film as the gate electrode 54 is first made relatively large, the gate electrode 54 can be formed to such a height as shown in FIG. 14. Thus, the difference in level between the contacts on the gate electrode 54 and the contacts on the source and drain diffusion layers 15 and 16 can be reduced.

The formation of a fine gate pattern on the device isolation insulating film 12 is relatively easy even when the level difference between the substrate projection 51A and that insulating film 12 is large. This is because, unlike the formation of a contact hole, in the formation of a gate pattern there is space in the direction of the gate width.

By the structure of the semiconductor device shown in FIG. 14 and the manufacturing method, the aspect ratio of the contact holes can be reduced and the contact holes can be formed simultaneously on the gate electrode 54 and the source and drain diffused layers 15 and 16. Also, the parasitic resistance associated with the gate electrode 54 can be reduced because the thickness of the polysilicon film is large.

Sixth Embodiment

The sixth embodiment provides a semiconductor device in which the substrate projection is formed by epitaxial growth and the formation of contacts to the source and drain diffused layers is easy.

FIGS. 15A to 15D are sectional views, in the order of steps of manufacture, of the semiconductor device of the sixth embodiment. FIGS. 16A to 16C are plan views, in the order of steps of manufacture, of the semiconductor device.

Figure 15A:
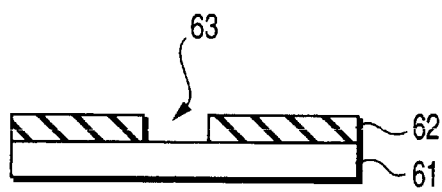
FIGS. 15A to 15D are sectional views, in the order of steps of manufacture, of a semiconductor device according to a sixth embodiment of the present invention.
Figure 16A:
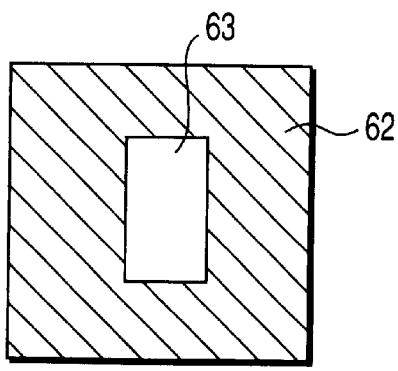
FIGS. 16A to 16C are plan views, in the order of steps of manufacture, of the semiconductor device according to the sixth embodiment of the present invention.
Figure 16B:
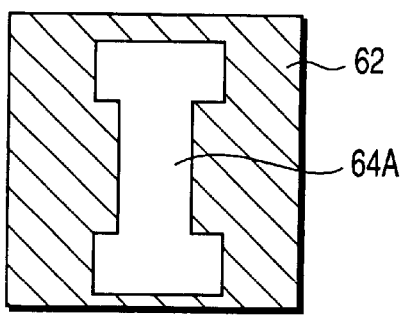
Figure 16C:
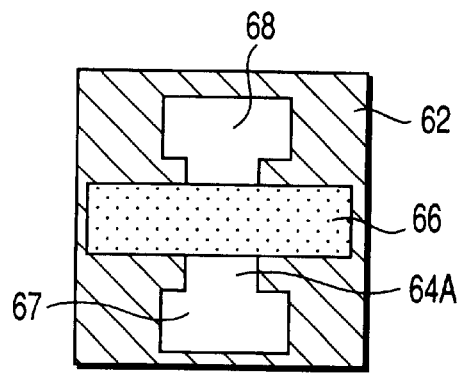

First, as shown in FIG. 15A, an insulating film 62 is formed on a semiconductor substrate 61. By means of lithographic and dry etching techniques, the insulating film 62 is patterned to form an opening 63 in the region where the channel of a MISFET is to be formed. The plan view of the structure at this stage is illustrated in FIG. 16A.

Figure 15B:
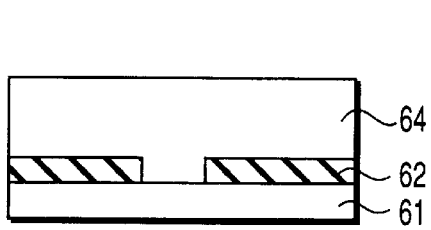

Subsequently, epitaxial growth of silicon is performed using the exposed silicon semiconductor substrate 61 as a seed. As a result, as shown in FIG. 15B, an overgrown epitaxial layer 64 of silicon is formed over the insulating film 62.

Next, the epitaxial layer 64 is patterned by means of lithographic and dry etching techniques to form a substrate projection 64A where the source, the drain and the channel are to be formed. The plan view of the structure at this stage is illustrated in FIG. 16B. In this figure, the upper and lower portions where the source and drain diffused regions are to be formed are made larger in width than the central portion where the channel is to be formed.

Figure 15D:
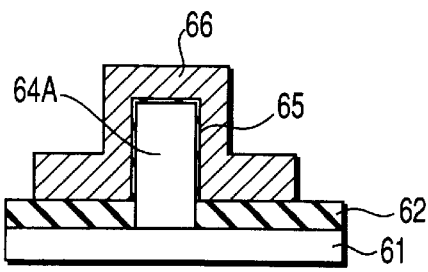
Figure 15C:
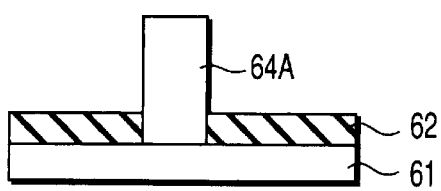

Next, as shown in FIG. 15D, a gate insulating film 65 is formed on the top surface and side surfaces of the substrate projection 64A. A gate electrode material is deposited on the gate insulating film 65 and then patterned by lithographic and dry etching techniques to form a gate electrode 66. By self-aligned ion implantation using the gate electrode pattern as a mask, phosphorous (p) or arsenic (AS) is introduced into the portions of the substrate projection 64A except below the gate electrode to form the source and drain diffused layers 67 and 68. The plan view of the structure at this point is illustrated in FIG. 16C. The perspective view of the semiconductor device thus fabricated is illustrated in FIG. 17.

Figure 17:
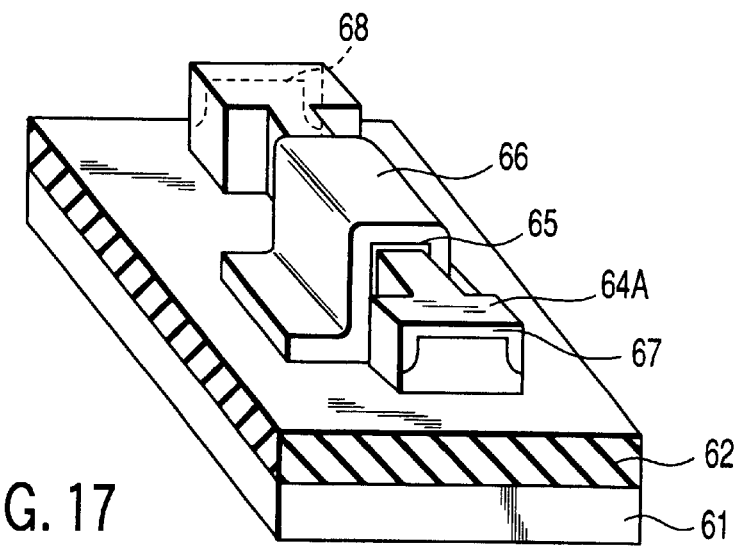
FIG. 17 is a perspective view of the semiconductor device according to the sixth embodiment of the present invention.

With the semiconductor device shown in FIG. 17, insulation of the source and drain regions of a MISFET called the delta or fin type from the substrate can be obtained. As a result, even if the device-to-device spacing is reduced, there is little possibility of erroneous conduction between adjacent devices and hence the device isolation characteristic can be improved. In addition, the channel portion is formed of the epitaxial layer 64 grown from the semiconductor substrate 61; thus, the bias to the channel can be controlled from the side of the semiconductor substrate 61.

As in the case of the structure shown in FIGS. 10 and 11A to 11D, the length in the direction perpendicular to the direction of the channel length of the portions of the substrate projection in which the source and drain regions are formed is made larger than the corresponding length of the central portion where the channel is formed. In other words, the length in the direction parallel to the surface of the substrate and perpendicular to the direction from source to drain of that portion of the substrate projection on which the gate electrode is located is made shorter than the length in the corresponding direction of those portions of the substrate projection where the source and drain regions are formed.

Thus, the same operation as SOI devices can be achieved with the thin channel portion and the resistivity of the source and drain portions can be reduced. In addition, the formation of contacts to the source and drain regions can be made easy.

With the semiconductor device of this embodiment, since the channel is electrically connected with the substrate, a bias can be applied to the substrate, allowing threshold voltage control to be performed and the substrate floating effect to be reduced. Moreover, the channel and the source and drain regions are formed from monocrystalline silicon, allowing the parasitic resistance to be reduced.

Although the present invention has been described in terms of n-channel MIS field effect transistors, p-channel MIS field effect transistors can also be fabricated simply by changing the conductivity type using suitable process conditions.

According to an aspect of the present invention, as described above, semiconductor devices can be provided which are allowed to operate as fully depleted devices even if the gate length is very short and can reduce heat resulting from the Joule effect and the substrate floating effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate of a first conductivity type;
    an insulating film including a first portion and a second portion formed on the semiconductor substrate;
    a semiconductor projection of the first conductivity type comprising a first side surface and a second side surface formed between the first portion and the second portion of the insulating film, the semiconductor projection being projected from a surface of the insulating film, a bottom of the semiconductor projection being connected to the semiconductor substrate;
    a gate electrode formed on the first side surface of the semiconductor projection with a gate insulating film interposed therebetween;
    a source region and a drain region of a second conductivity type formed in the first side surface of the semiconductor projection, the source region and the drain region being located on both sides of the gate electrode;
    a first impurity region of the first conductivity type formed in a portion of the semiconductor substrate below the first portion of the insulating film; and
    a second impurity region of the first conductivity type formed in a portion of the semiconductor substrate below the second portion of the insulating film, the second impurity region being in contact with the first impurity region in a portion of the semiconductor substrate below the semiconductor projection.

2. The semiconductor device according to claim 1, further comprising a third impurity region of the first conductivity type formed in the top surface of the semiconductor projection, the third impurity region being higher in doping level than the semiconductor layer of the semiconductor projection.

3. The semiconductor device according to claim 1, wherein the length in the direction parallel to the surface of the semiconductor substrate and perpendicular to the direction from the source region to the drain region of the portion of the semiconductor projection on which the gate electrode is located is shorter than the length in the corresponding direction of the portions of the semiconductor projection where the source and drain regions are formed.

4. A semiconductor device comprising:
    a semiconductor substrate of a first conductivity type;
    an insulating film including a first portion and a second portion formed on the semiconductor substrate;
    a semiconductor projection of the first conductivity type comprising a first side surface and a second side surface formed between the first portion and the second portion of the insulating film, the semiconductor projection being projected from a surface of the insulating film, a bottom of the semiconductor projection being connected to the semiconductor substrate;
    a gate electrode formed on the first side surface of the semiconductor projection with a gate insulating film interposed therebetween;
    a source region and a drain region of a second conductivity type formed in the first side surface of the semiconductor projection, the source region and the drain region being located on both sides of the gate electrode;
    a first impurity region of the first conductivity type formed in a portion of the semiconductor substrate below the first portion of the insulating film;
    a second impurity region of the first conductivity type formed in a portion of the semiconductor substrate below the second portion of the insulating film; and
    a contact plug buried in a hole formed in at least one of the first portion and the second portion of the insulating film, the contact plug being connected with a corresponding one of the first and second impurity regions.

5. The semiconductor device according to claim 4, further comprising a third impurity region of the first conductivity type formed in the top surface of the semiconductor projection, the third impurity region being higher in doping level than the semiconductor layer of the semiconductor projection.

6. The semiconductor device according to claim 4, wherein the length in the direction parallel to the surface of the semiconductor substrate and perpendicular to the direction from the source region to the drain region of the portion of the semiconductor projection on which the gate electrode is located is shorter than the length in the corresponding direction of the portions of the semiconductor projection where the source and drain regions are formed.

7. A semiconductor device comprising:
    a semiconductor substrate of a first conductivity type;
    an insulating film including a first portion and a second portion formed on the semiconductor substrate;
    a semiconductor projection of the first conductivity type comprising a first side surface and a second side surface and a top surface formed between the first portion and the second portion of the insulating film, the semiconductor projection being projected from a surface of the insulating film, a bottom of the semiconductor projection being connected to the semiconductor substrate;
    a gate insulating film formed on the first side surface of the semiconductor projection;
    a gate electrode formed on the gate insulating film on the first side surface of the semiconductor projection and above the top surface of the semiconductor projection;
    an insulating layer formed between the top surface of the semiconductor projection and the gate electrode, the insulating layer being larger in thickness than the gate insulating film;
    a source region and a drain region of a second conductivity type formed in the first side surface of the semiconductor projection, the source region and the drain region being located on both sides of the gate electrode;
    a first impurity region of the first conductivity type formed in a portion of the semiconductor substrate below the first portion of the insulating film; and
    a second impurity region of the first conductivity type formed in a portion of the semiconductor substrate below the second portion of the insulating film.

8. The semiconductor device according to claim 7, wherein the first and second impurity regions are in contact with each other in a portion of the semiconductor substrate below the semiconductor projection.

9. The semiconductor device according to claim 7, further comprising a contact plug buried in a hole formed in at least one of the first and second device isolation insulating films, the contact plug being connected with a corresponding one of the first and second impurity regions.

10. A semiconductor device comprising:
    a semiconductor substrate of a first conductivity type;
    an insulating film including a first portion and a second portion formed on the semiconductor substrate;

a semiconductor projection of the first conductivity type comprising a first side surface and a second side surface formed between the first portion and the second portion of the insulating film, the semiconductor projection being projected from a surface of the insulating film, a bottom of the semiconductor projection being connected to the semiconductor substrate;

a first gate electrode formed on the first side surface of the semiconductor projection with a gate insulating film interposed therebetween;

a second gate electrode formed on the second side surface of the semiconductor projection with a gate insulating film interposed therebetween, the second gate electrode being separated from and opposed to the first gate electrode with the semiconductor projection interposed therebetween;

source regions and drain regions of a second conductivity type formed in the first side surface and the second side surface of the semiconductor projection, the source regions and the drain regions being located on both sides of the first gate electrode and the second gate electrode;

a first impurity region of the first conductivity type formed in a portion of the semiconductor substrate below the first portion of the insulating film; and a second impurity region of the first conductivity type formed in a portion of the semiconductor substrate below the second portion of the insulating film.

11. The semiconductor device according to claim 10, wherein a different voltage is applied to each of the first and second gate electrodes for threshold voltage control.

12. The semiconductor device according to claim 11, wherein the first and second impurity regions are in contact with each other in a portion of the semiconductor substrate below the semiconductor projection.

13. The semiconductor device according to claim 10, further comprising a contact plug buried in a hole formed in at least one of the first and second device isolation insulating films, the contact plug being connected with a corresponding one of the first and second impurity regions.

14. A semiconductor device comprising:

a semiconductor substrate of a first conductivity type;

an insulating film including a first portion and a second portion formed on the semiconductor substrate;

a semiconductor projection comprising a stack of a first impurity region of the first conductivity type, a second impurity region of a second conductivity type and a third impurity region of the first conductivity type, the first impurity region underlying the second impurity region, the second impurity region underlying the third impurity region, the semiconductor projection being formed between the first portion and the second portion of the insulating film, the semiconductor projection being projected from a surface of the insulating film, a bottom of the semiconductor projection being connected to the semiconductor substrate, the semiconductor projection comprising a first side surface and a second side surface of the third impurity region;

a gate electrode formed on the first side surface of the third impurity region of the semiconductor projection with a gate insulating film interposed therebetween;

a source region and a drain region of the second conductivity type formed in the first side surface of the third impurity region of the semiconductor projection, the source region and the drain region being located on both sides of the gate electrode;

a fourth impurity region of the first conductivity type formed in a portion of the semiconductor substrate below the first portion of the insulating film; and a fifth impurity region of the first conductivity type formed in a portion of the semiconductor substrate below the second portion of the insulating film.

15. The semiconductor device according to claim 14, wherein the first, fourth and fifth impurity regions are in contact with one another in a portion of the semiconductor substrate below the semiconductor projection.

16. A semiconductor device comprising:

a semiconductor substrate of a first conductivity type;

an insulating film including a first portion and a second portion formed on the semiconductor substrate;

a semiconductor projection of the first conductivity type comprising side surfaces and a top surface formed between the first portion and the second portion of the insulating film, the semiconductor projection being projected from a surface of the insulating film, a bottom of the semiconductor projection being connected to the semiconductor substrate;

a gate electrode formed on the side surfaces and the top surface of the semiconductor projection with a gate insulating film interposed therebetween, the gate electrode comprising a top surface parallel to a surface of the semiconductor substrate;

source regions and drain regions of a second conductivity type formed in the side surfaces of the semiconductor projection, the source regions and the drain regions being located on both sides of the gate electrode;

a first impurity region of the first conductivity type formed in a portion of the semiconductor substrate below the first portion of the insulating film; and a second impurity region of the first conductivity type formed in a portion of the semiconductor substrate below the second portion of the insulating film, the top surface of the gate electrode being made flat over the top surface of the semiconductor projection and the first and second portions of the insulating film.

17. The semiconductor device according to claim 16, wherein the first and second impurity regions are in contact with each other in a portion of the semiconductor substrate below the semiconductor projection.

18. The semiconductor device according to claim 16, further comprising a contact plug buried in a hole formed in at least one of the first and second device isolation insulating films, the contact plug being connected with a corresponding one of the first and second impurity regions.

19. A semiconductor device comprising:

an insulating film formed on a semiconductor substrate;

a projecting semiconductor layer formed in a hole of the insulating film and extended on the insulating film, the projecting semiconductor layer being projected from a surface of the insulating film, the projecting semiconductor layer comprising end portions and a center portion including a first side surface and a second side surface, a length of the center portion of the projecting semiconductor layer in a width direction being shorter than that of the end portions of the projecting semiconductor layer in the width direction;

a gate electrode formed on the first side surface of the center portion of the projecting semiconductor layer with a gate insulating film interposed therebetween; and a source region and a drain region formed in the end portions of the projecting semiconductor layer, the source region and the drain region being located on both sides of the gate electrode.

20. The semiconductor device according to claim 1, wherein the gate electrode is also formed on the second side surface of the semiconductor projection.

21. The semiconductor device according to claim 4, wherein the gate electrode is also formed on the second side surface of the semiconductor projection.

22. The semiconductor device according to claim 7, wherein the gate electrode is also formed on the second side surface of the semiconductor projection.

23. The semiconductor device according to claim 14, wherein the gate electrode is also formed on the second side surface of the third impurity region of the semiconductor projection.

24. The semiconductor device according to claim 19, wherein the projecting semiconductor layer is an epitaxial layer grown by an epitaxial growth method.

25. The semiconductor device according to claim 24, wherein the gate electrode is also formed on the second side surface of the center portion of the projecting semiconductor layer.

* * * * *

UNITED STATES PATENT AND TRADEMARK OFFICE
CERTIFICATE OF CORRECTION

PATENT NO.   : 6,525,403 B2
DATED        : February 25, 2003
INVENTOR(S)  : Inaba et al.

It is certified that error appears in the above-identified patent and that said Letters Patent is hereby corrected as shown below:

<u>Title page,</u>
Item [54], Title, change "TRANSISTORS OR" to -- TRANSISTORS OF --.

Signed and Sealed this

Fifteenth Day of April, 2003

JAMES E. ROGAN
*Director of the United States Patent and Trademark Office*